United States Patent
Zanati et al.

(10) Patent No.: US 12,074,124 B2
(45) Date of Patent: Aug. 27, 2024

(54) INTEGRATED CIRCUIT PACKAGE WITH INTEGRATED WAVEGUIDE LAUNCHER

(71) Applicant: NXP B.V., Eindhoven (NL)

(72) Inventors: Abdellatif Zanati, Hamburg (DE); Adrianus Buijsman, Nijmegen (NL); Dominik Xaver Simon, Munich (DE)

(73) Assignee: NXP B.V., Eindhoven (NL)

( * ) Notice: Subject to any disclaimer, the term of this patent is extended or adjusted under 35 U.S.C. 154(b) by 140 days.

(21) Appl. No.: 17/643,056

(22) Filed: Dec. 7, 2021

(65) Prior Publication Data

US 2022/0189894 A1 Jun. 16, 2022

(30) Foreign Application Priority Data

Dec. 16, 2020 (EP) ..................................... 20214555

(51) Int. Cl.
| | |
|---|---|
| H01L 23/66 | (2006.01) |
| H01L 23/31 | (2006.01) |
| H01L 23/498 | (2006.01) |
| H01L 23/552 | (2006.01) |
| H01Q 9/04 | (2006.01) |
| H05K 1/02 | (2006.01) |

(52) U.S. Cl.
CPC .......... *H01L 23/66* (2013.01); *H01L 23/3107* (2013.01); *H01L 23/49811* (2013.01); *H01L 23/49822* (2013.01); *H01L 23/552* (2013.01); *H01Q 9/0407* (2013.01); *H05K 1/0237* (2013.01); *H01L 2223/6627* (2013.01); *H05K 2201/10098* (2013.01)

(58) Field of Classification Search
CPC ............. H01L 23/66; H01L 2223/6627; H01L 23/3128; H01L 23/5384
See application file for complete search history.

(56) References Cited

U.S. PATENT DOCUMENTS

| | | |
|---|---|---|
| 5,969,461 A | 10/1999 | Anderson et al. |
| 7,084,723 B2 | 8/2006 | Tamaki |
| 7,522,014 B2 | 4/2009 | Koriyama |
| 8,168,464 B2 | 5/2012 | Tang |
| 8,283,764 B2 | 10/2012 | Tang |
| 9,318,449 B2 | 4/2016 | Hasch et al. |
| 9,666,930 B2 | 5/2017 | Tang et al. |
| 9,679,881 B2 | 6/2017 | Pagaila et al. |
| 10,103,447 B2 | 10/2018 | Tong et al. |
| 2002/0074654 A1 | 6/2002 | Koriyama |
| 2004/0103509 A1 | 6/2004 | Bidard et al. |
| 2004/0118599 A1 | 6/2004 | Chason et al. |

(Continued)

FOREIGN PATENT DOCUMENTS

| | | | |
|---|---|---|---|
| JP | 2005020046 A | * | 1/2005 |
| KR | 100856497 | * | 9/2008 |

*Primary Examiner* — Michele Fan

(57) ABSTRACT

An integrated circuit package comprising an encapsulant, a semiconductor die in the encapsulant the semiconductor die comprising a plurality of die terminals, an integrated waveguide launcher, wherein the integrated waveguide launcher is connected to one of the die terminals and a land grid array provided on a bottom surface of the package. The land grid array comprises a plurality of package terminals, each package terminal configured to be soldered to a printed circuit board, and an opening, wherein the opening is aligned with the integrated waveguide launcher.

17 Claims, 7 Drawing Sheets

(56) References Cited

U.S. PATENT DOCUMENTS

| | | |
|---|---|---|
| 2008/0042773 A1 | 2/2008 | Koriyama |
| 2008/0266196 A1 | 10/2008 | Shi |
| 2011/0037530 A1 | 2/2011 | Mangalahgari et al. |
| 2012/0223325 A1 | 5/2012 | Tang |
| 2012/0248587 A1 | 10/2012 | Alleaume et al. |
| 2013/0127562 A1 | 5/2013 | Purden et al. |
| 2014/0291835 A1 | 10/2014 | Demin et al. |
| 2014/0375525 A1 | 12/2014 | Shi |
| 2015/0229017 A1 | 8/2015 | Suzuki et al. |
| 2015/0364830 A1 | 12/2015 | Tong et al. |
| 2016/0118705 A1* | 4/2016 | Tang ................. H01L 23/66 438/31 |
| 2016/0197400 A1 | 7/2016 | Zimmerman et al. |
| 2017/0033062 A1 | 2/2017 | Liu et al. |
| 2017/0271761 A1 | 9/2017 | Purden et al. |
| 2018/0108968 A1 | 4/2018 | Purden et al. |
| 2018/0226709 A1 | 8/2018 | Mangaiahgari |
| 2019/0089042 A1 | 3/2019 | Purden et al. |
| 2019/0245257 A1 | 8/2019 | Foroozesh et al. |
| 2021/0134612 A1 | 5/2021 | Van Gemert et al. |

\* cited by examiner

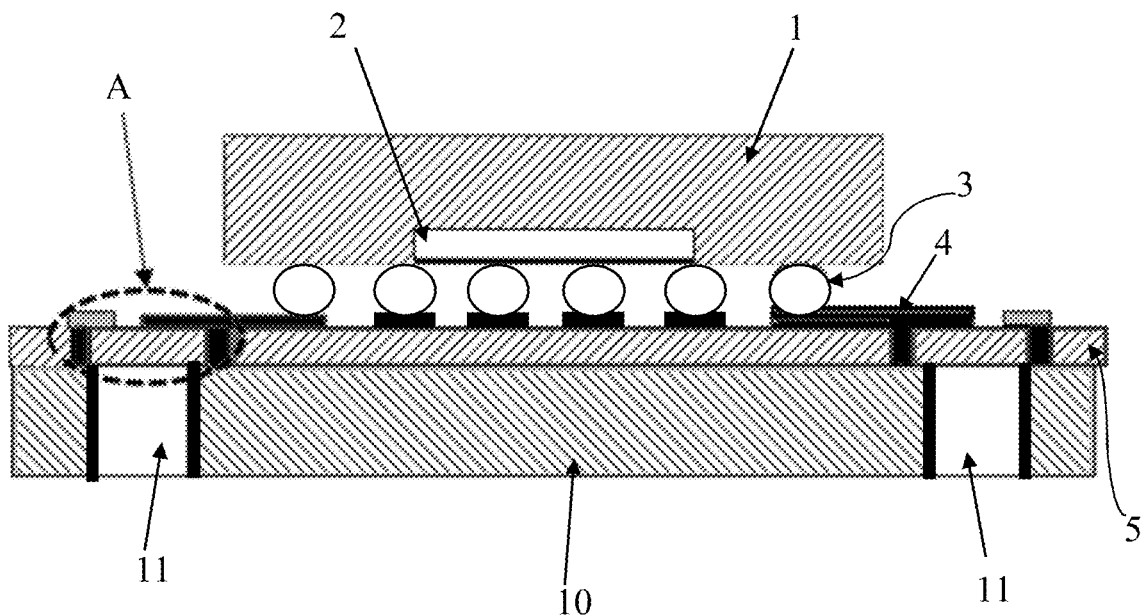
PRIOR ART – Fig. 1
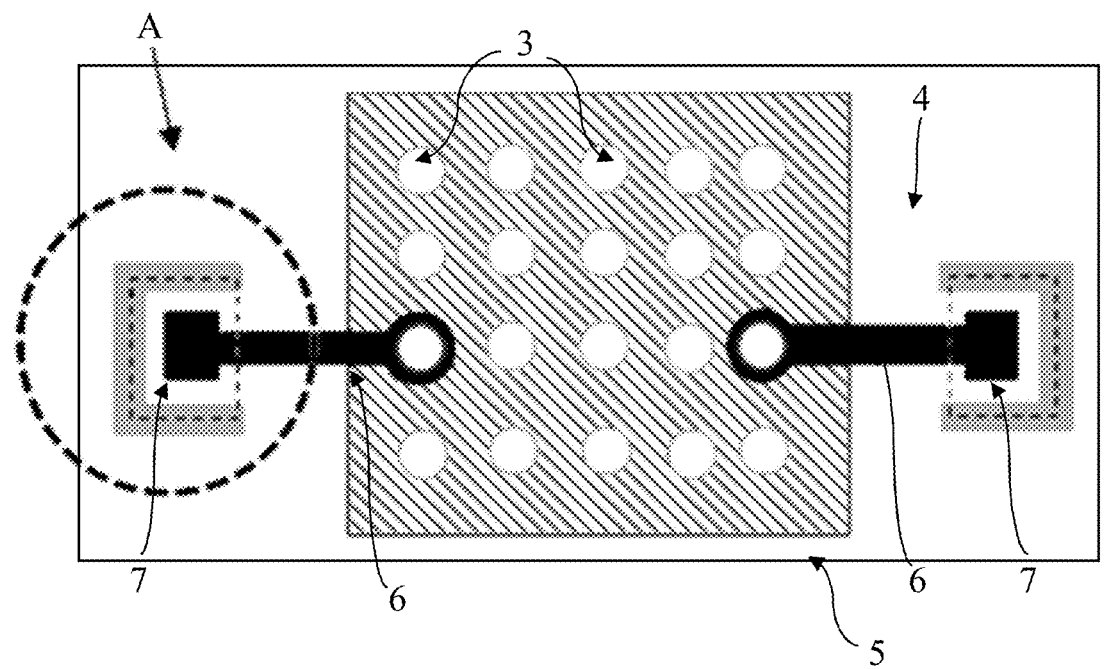
PRIOR ART – Fig. 2

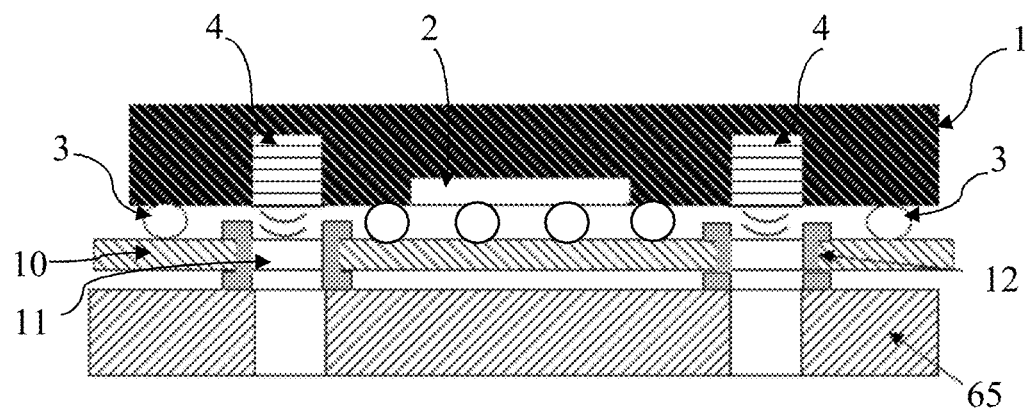
PRIOR ART - Fig. 3
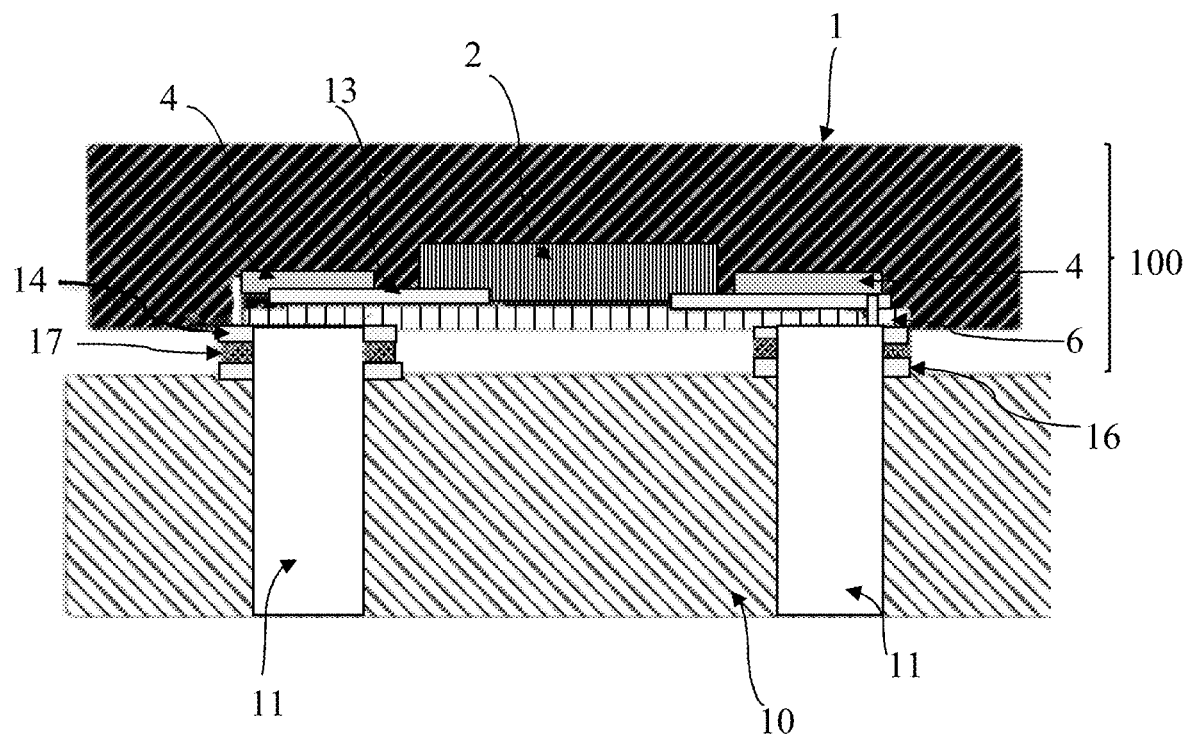
Fig. 4

INTEGRATED CIRCUIT PACKAGE WITH INTEGRATED WAVEGUIDE LAUNCHER

CROSS-REFERENCE TO RELATED APPLICATIONS

This application claims the priority under 35 U.S.C. § 119 of European Patent application no. 20214555.3, filed on 16 Dec. 2020, the contents of which are incorporated by reference herein.

BACKGROUND

The present specification relates to integrated circuit (IC) packages and to semiconductor devices comprising integrated circuit packages.

Nowadays the trend goes to higher integration of mm wave transceivers in small integrated circuit packages. Practical applications of these packages include automotive radar at 77 GHz and beyond and 5G communication systems at 60 GHz and beyond. As an example, radar integrated circuit packages with integrated transmitters and receiver are available for automotive radar applications at 77 GHz.

Integrated circuit packages are generally soldered on a printed circuit board (PCB) using a ball grid array with solder balls. The connection to the antenna is commonly realized through microstrip lines. Mostly, the PCB material consists of mm-wave substrates such as Rogers 3003. These substrates are expensive. The long feed lines needed for routing the mm-wave paths are lossy. Losses around 4 dB per channel from the package output to the antenna centre are typical. These losses reduce the signal-to-noise ratio (SNR) which lowers the performance of the semiconductor device.

To attempt to overcome this issue, it is known to use waveguide antennas which are made through 3D printing, moulding or milling. The 3D waveguide antenna allows to build complex structure like antenna arrays and power combiner with high performance at very low loss. This allows the use of shorter waveguide transitions on the PCB as a feed for the 3D waveguide structure. This solution still requires the usage of a relatively expensive mm-wave substrate. Typically, the waveguide transition causes a loss of roughly 2 dB per channel.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an integrated circuit package comprising: an encapsulant; a semiconductor die in the encapsulant, the semiconductor die comprising a plurality of die terminals; an integrated waveguide launcher, wherein the integrated waveguide launcher is connected to one of the die terminals; and a land grid array provided on a bottom surface of the package, the land grid array comprising: a plurality of package terminals, each package terminal configured to be soldered to a connection; and an opening, wherein the opening is aligned with the integrated waveguide launcher.

The land grid array is provided instead of a ball grid array which is conventionally used to mount an integrated circuit package to a substrate such a printed circuit board (PCB).

The present disclosure may provide an improved transition between an integrated circuit package (or package) with an integrated launcher on the bottom side of the package and a PCB. Removing the solder balls eliminates air gaps that lead to discontinuities of the surface current of the waveguide. Discontinuities in waveguides causes signal mismatch, which reduces isolation and results in higher signal loss.

This present disclosure proposes a mm-wave transition which is integrated in a package with a radiating element on the bottom surface. The integrated waveguide launcher and land grid array enable a low-cost but high-performance package which can be integrated into any standard package technology and can be matched to any PCB material.

Each of the package terminals may be configured to be soldered to a PCB. Optionally, each package terminal comprises a coating to enable an electrical connection with a respective connection on the PCB. For example, the coating may comprise: organic surface protection (OSP), a metallic coating such as Silver or Tin (Sn), presolder, or solder.

The integrated circuit package may be a flat integrated circuit package. The package may comprise a substrate or package substrate.

The opening in the land grid array may be referred to as a waveguide opening, as it may feed a waveguide integrated on a PCB. In other embodiments, the opening may feed an antenna, or other structure.

Optionally the opening is rectangular, circular, elliptical or slotted.

Optionally, the opening is provided in one of the package terminals. The package terminal may equivalently be referred to as an AC/DC contact pad.

Optionally, the land grid array comprises a metal pad and the opening is provided in the metal pad. The metal pad may be a copper pad.

Optionally, the opening may be surrounded by soldermask. In some embodiments, the opening may be surrounded by a ring of vias or micro-vias. The vias may be filled with electrically conductive material.

The land grid array may comprise a plurality of openings. For example, a plurality of openings may be provided in the metal pad. Additionally or alternatively, a plurality of package terminals may each comprise one of the plurality of openings.

The package may comprise a redistribution layer between the semiconductor die and the land grid array. The waveguide launcher may be provided in the redistribution layer.

Optionally, the redistribution layer comprises a single metal layer. This may reduce the manufacturing cost of the package.

The package may comprise a multi-layer laminate. The waveguide launcher may be surface mounted to the multi-layer laminate, or at least partially embedded into the multi-layer laminate.

The waveguide launcher geometry may be matched to the semiconductor die. The waveguide launcher may convert the die terminal mode to a waveguide mode. The die terminals may be single ended terminals or differential terminals.

The package may comprise a shield arranged to reflect radiation from the waveguide launcher towards the opening. The shield may be an integrated shield provided in the encapsulant. The shield reduces electromagnetic radiation losses and improves isolation.

Optionally, the shield, or a portion of the shield, is attached by a non-conductive adhesive to the redistribution layer, or to the multi-layer laminate. The shield may comprise a substrate glued to a top surface of the multi-layer laminate.

Optionally, the shield is a periodically structured shield. The periodically structured shield may act as a surface wave filter to stop the propagation of the electromagnetic radiation.

The periodically structured shield may comprise a plurality of periodically spaced structures. The periodically spaced structures may be attached or mounted to a top surface of the shield. The periodically spaced structures may be made of a conductive material, such as copper.

Optionally, the shield comprises a back-short or reflector.

If the shield comprises a back-short or reflector, a top surface of the shield may be metallized. Thus, the shield may comprise a conductive cover. The conductive cover may be connected to the land grid array by one or more vias. The vias may connect the conductive cover to a ground plate of the land grid array.

Optionally, the shield comprises a layer of silicon and/or epoxy and/or PCB laminate.

Optionally, the shield is located in the encapsulant adjacent the semiconductor die.

Optionally, the shield covers a top surface of the package. This may improve the electromagnetic sensitivity of the die and improve the mechanical characteristics of the package.

According to another aspect of the present disclosure, there is provided a semiconductor device, comprising the integrated circuit package of any embodiment or example of the first aspect of the disclosure; and a printed circuit board, PCB, comprising a waveguide, wherein: each package terminal is soldered to the PCB; and the waveguide is aligned with the opening provided in the land grid array.

The opening in the land grid array may be referred to as a waveguide opening.

In the present disclosure, the soldering of the package to the PCB ensures that the transition between the mm-wave transition on chip and the PCB is gap free in three dimensions and thus no discontinuities for the surface currents can occur.

Furthermore, the package terminals are directly soldered to the PCB. No interface layer is required. This results in a mm-wave transition that is self-adjusted, thus misalignment of the waveguide launcher and the PCB integrated waveguide is avoided.

Optionally, the PCB comprises an FR4 substrate. This may be preferred as it is a relatively low-cost substrate.

Optionally, the waveguide is a dielectric filled waveguide. For example, the waveguide may be filled with epoxy. The use of a dielectric filled waveguide rather than an air-filled waveguide may allow the length of the waveguide and thus the size of the package to be reduced, which may be more cost effective.

Optionally, the waveguide is a hollow waveguide, or an air-filled waveguide.

The shape and/or geometry of the opening (or waveguide opening) is preferably configured to match the waveguide in the PCB. For example, the waveguide opening may be rectangular, square, circular, or elliptical.

Optionally, the PCB comprises a resonant patch antenna configured to match the land grid array to the waveguide. The resonant patch antenna may be provided on a top surface of the PCB between the PCB and the land grid array. Alternatively, the resonant patch antenna may be provided in an inner layer of the PCB, or on a bottom surface of the PCB. The resonant patch antenna may be required to match the PCB substrate to the package substrate, thereby reducing or eliminating the presence of discontinuities in the path taken by electromagnetic radiation, reducing losses.

The semiconductor device may comprise a heat sink. The heat sink may be in contact with a top surface of the integrated circuit package. The heat sink can act as an external shield to protect the integrated circuit package from external electromagnetic radiation.

The heat sink may be connected to the semiconductor device by one or more mechanical fixings, such as bolts or screws.

The semiconductor device may comprise an antenna feed network coupled to the PCB and an antenna array coupled to the antenna feed network. Optionally, the antenna array may be a slot antenna.

Optionally, the semiconductor device may be a mm-wave sensor. For example, the sensor may be suitable for use at frequencies of up to 60 GHz, or 100 to 160 GHz, for example 144 GHz. It will be appreciated that the present disclosure is not limited to these frequencies, nor is this an exhaustive list of suitable frequencies.

According to another aspect of the present disclosure, there is provided an integrated circuit package comprising: an encapsulant; a semiconductor die in the encapsulant, the semiconductor die comprising a plurality of die terminals; an integrated waveguide launcher in the encapsulant, wherein the integrated waveguide launcher is connected to one of the die terminals; an opening provided in a bottom surface of the package, wherein opening is aligned with waveguide launcher; and an integrated shield in the encapsulant configured to reflect radiation from the waveguide launcher towards the opening. The shield may be as described in any of the above examples or embodiments of the present disclosure.

BRIEF DESCRIPTION OF THE DRAWINGS

Illustrative embodiments of this disclosure will be described hereinafter, by way of example only, with reference to the accompanying drawings in which like reference signs relate to like elements and in which:

FIG. 1 is a cross-sectional view of a prior art semiconductor device comprising an integrated circuit package, waveguide launcher and PCB;

FIG. 2 is plan view of the prior art waveguide launcher in FIG. 1;

FIG. 3 is a cross-sectional view of a prior art semiconductor device comprising an integrated circuit package with an integrated waveguide launcher mounted to a PCB;

FIG. 4 is a cross-sectional view of semiconductor device according to an embodiment of the disclosure;

DETAILED DESCRIPTION

Figure 5:
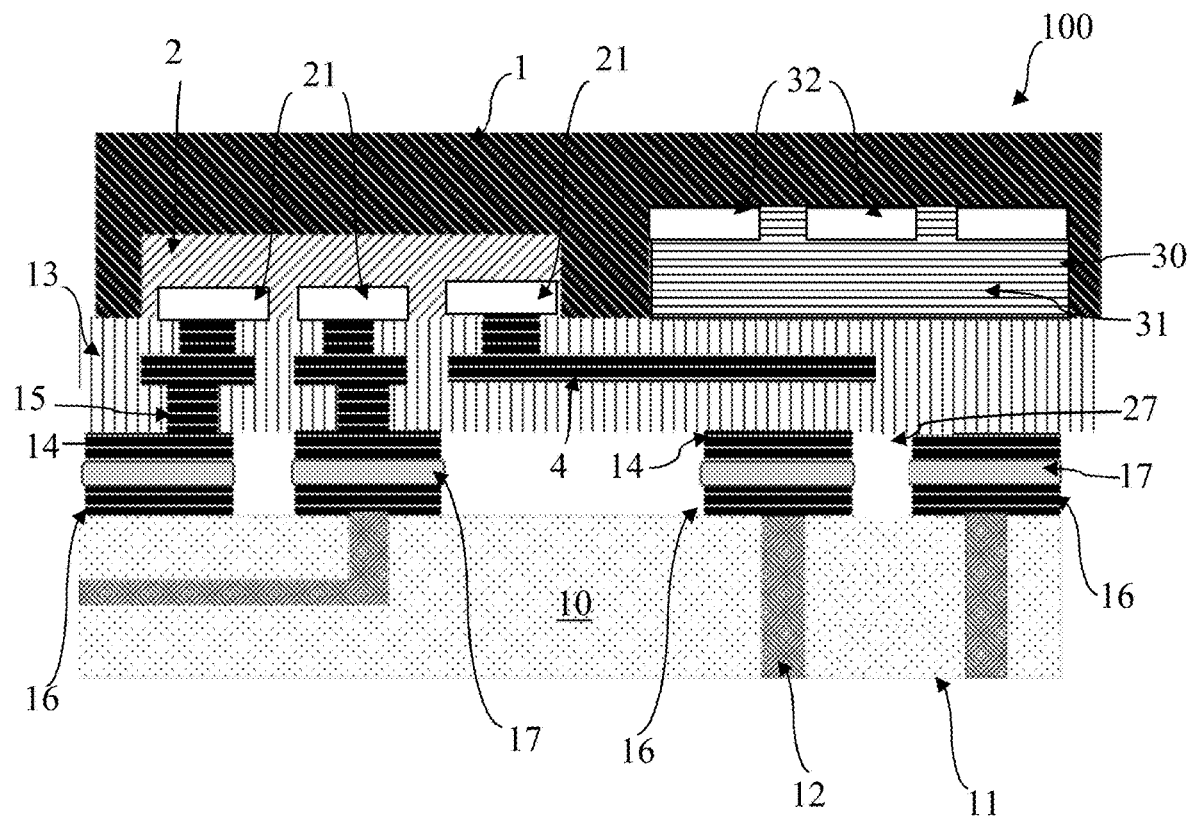
FIG. 5 is a cross-sectional view of semiconductor device comprising a periodically structured shield according to another embodiment of the disclosure.

Embodiments of this disclosure are described in the following with reference to the accompanying drawings. It will be appreciated that the drawings are schematic illustrations and are not drawn to scale.

FIG. 1 shows a cross-sectional illustration of a prior art semiconductor device. The semiconductor device comprises an integrated circuit package comprising a semiconductor die 2 surrounded by an encapsulant 1. The semiconductor die 2 may equivalently be referred to as a die or chip. A ball grid array comprising solder balls 3 mechanically and electrically connects the die 2 to a waveguide launcher 4. The waveguide launcher 4 is integrated on a substrate 5. The substrate 5 is mounted to a printed circuit board (PCB) 10 comprising integrated waveguides 11. The waveguide launchers 4 are aligned with the waveguides 11. Alternatively, the PCB 10 may be replaced by a slot antenna.

FIG. 2 shows the waveguide launchers 4 and ball grid array of FIG. 1 in more detail. Section A in FIG. 2 corresponds to section A indicated by the dotted lines in FIG. 1. The waveguide launchers comprise a signal transmission line 6 having a first end and a second end 7. The first end of the signal transmission line 6 is electrically connected to one of the solder balls 3 of the ball grid array on the interface layer 5. The second end 7 of the signal transmission line 6 is radiating into the waveguide 11. The connection from the solder balls 3 to the waveguide 11 using signal transmission line 6, 7 results in significant losses, typically of the order of 2 dB which reduces the SNR.

FIG. 3 shows another example of a prior art semiconductor device wherein the integrated circuit package comprises a pair of integrated waveguide launchers 4. A ball grid array comprising solder balls 3 mounts the package to a PCB 10. The PCB 10 comprises a pair of integrated waveguides 11 each with a metalized lining 12. The waveguide launchers 4 are aligned with the waveguides 11 in the PCB 10, so as to direct a signal (depicted by the curved lines) through the waveguide 11. In this example, the PCB 10 is mounted to a slot antenna array 65.

In FIG. 3, the solder balls 3 result in an air gap between the package (or waveguide launchers 4) and the waveguides 11. The air gaps can lead to discontinuities of the surface current of the waveguide, causing mismatch, higher insertion loss and radiation leakage. In addition, the PCB substrate 10 usually consists of mm-wave substrates such as Rogers 3003 which are expensive. The waveguide launcher 4 and the waveguides 11 can also become misaligned which also increases losses.

An embodiment of a semiconductor device according to the present disclosure is shown in FIG. 4. The integrated circuit package 100 comprises a semiconductor die 2 and integrated waveguide launchers 4 both surrounded by an encapsulant or mold 1. The die 2 is electrically connected to the waveguide launchers 4 by a redistribution layer 13 mounted on a package substrate 6. A bottom surface of the package 100 comprises a land grid array comprising package terminals 14 (shown in more detail in FIGS. 8 to 10) which are electrically connected by solder or solder paste 17 to connections 16 on the PCB 10. The PCB 10 may comprise a low-cost substrate such as FR4.

The PCB 10 comprises integrated waveguides 11, which may be hollow or filled with a dielectric. As shown, in FIG. 4, there are no air gaps between the waveguide launchers 4 and the waveguides 11. Also, by directly soldering the package terminals 14 to the PCB connections 16 the integrated waveguide launcher 4 cannot become misaligned from the PCB.

Another embodiment of a semiconductor device according to the present disclosure is shown in FIG. 5. The semiconductor die 2 comprises a plurality of die terminals 21. A redistribution layer 13 is provided between the die 2 and a land grid array on the bottom surface of the package 100. The land grid array comprises package terminals 14 and waveguide openings 27. A plurality of the die terminals 21 are electrically connected to respective package terminals 14 by a metalized structure 15 in the redistribution layer 13.

The redistribution layer 13 also comprises an integrated waveguide launcher 4 connected to one of the die terminals 21. The die 2 may have single ended terminals or differential terminals. The waveguide launcher 4 converts the die terminal mode to a waveguide mode. The waveguide launcher 4 is arranged such that the electromagnetic radiation emitted is directed towards waveguide openings 27 in the land grid array. The package terminals 14 are soldered 17 to connections 16 on the PCB 10. The PCB 10 comprises an integrated waveguide 11 having a metallic lining 12. The waveguide 11 may be filled with a dielectric material, or it may be hollow. The waveguide 11 is aligned with waveguide openings 27 in the package.

The package 100 also comprises an integrated shield 30. As shown in FIG. 5, the shield 30 is surrounded by the encapsulant 1 adjacent to the die 2. The shield 30 reflects or partially reflects the electromagnetic radiation emitted by the waveguide launcher 4 towards the waveguide openings 27. This may reduce electromagnetic radiation losses and improve isolation. In this embodiment, the shield 30 is a periodically structured shield and comprises a first layer 31 and periodic structures 32 that act as a surface wave filter. The period structures 32 are made of conductive material, for example copper. The first layer 31 is mounted to a redistribution layer (RDL) 13. The first layer 31 may comprise or consist of silicon, epoxy or PCB laminate, but is not limited to these materials. The first layer 31 may equivalently be referred to as the substrate or shield substrate.

Figure 6:
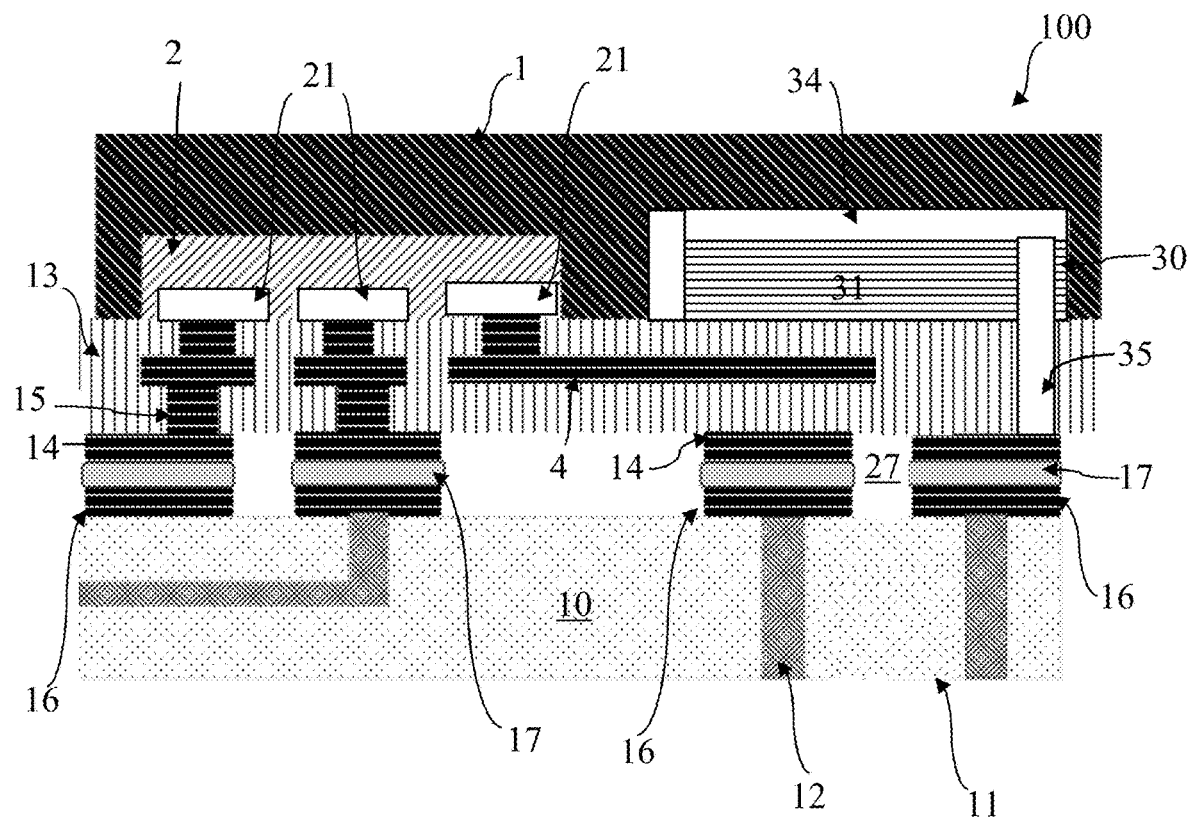
FIG. 6 is a cross-sectional view of semiconductor device comprising a back-short according to another embodiment of the disclosure.

FIG. 6 shows the semiconductor device of FIG. 5, wherein the shield comprises a back-short 30 rather than a periodically structured shield. In this embodiment, the back-short 30 comprises a first layer 31 and a conductive cover 34. The conductive cover 34 comprises vias 35 which connect the conductive cover 34 to the land grid array, optionally to a ground of the land grid array. In this embodiment an adhesive is not required to mount the first layer 31 to redistribution layer 13. The first layer 31 may comprise or consist of silicon, epoxy or PCB laminate, but is not limited to these materials.

Figure 7:
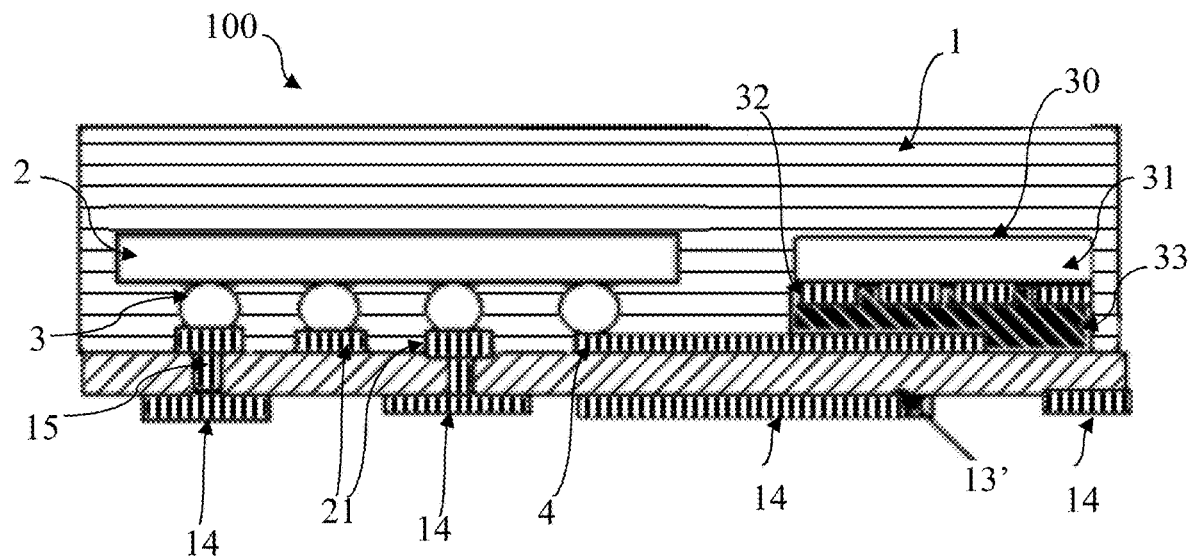
FIG. 7 shows a cross-sectional view of an integrated circuit package comprising a periodically structured shield according to a further embodiment of the present disclosure.

Another embodiment of an integrated circuit package 100 is shown in FIG. 7. In FIG. 7, the semiconductor die 2 is connected by solder balls 3 to die terminals 21 and to an integrated waveguide launcher 4. It will be appreciated that alternative electrical connections to the solder balls 3 may be used. The die terminals 21 are connected to package terminals 14 on a bottom surface of the package 100 by vias or other electrical connections 15 provided on a multi-layer laminate 13'. The package terminals 14 are provided in a land grid array.

In FIG. 7, the package 100 comprises a periodically structured shield 30, which is similar to the shield shown in FIG. 5. A plurality of periodic structures 32 made of conductive material are attached to the first layer (or substrate) 31. The first layer (or substrate) 31 may comprise or consist of silicon, epoxy or PCB laminate, but is not limited to these materials. The shield 30 is mounted above the waveguide launcher 4 and to a top surface of the multi-layer laminate 13' by a non-conductive adhesive 33.

Figure 8:
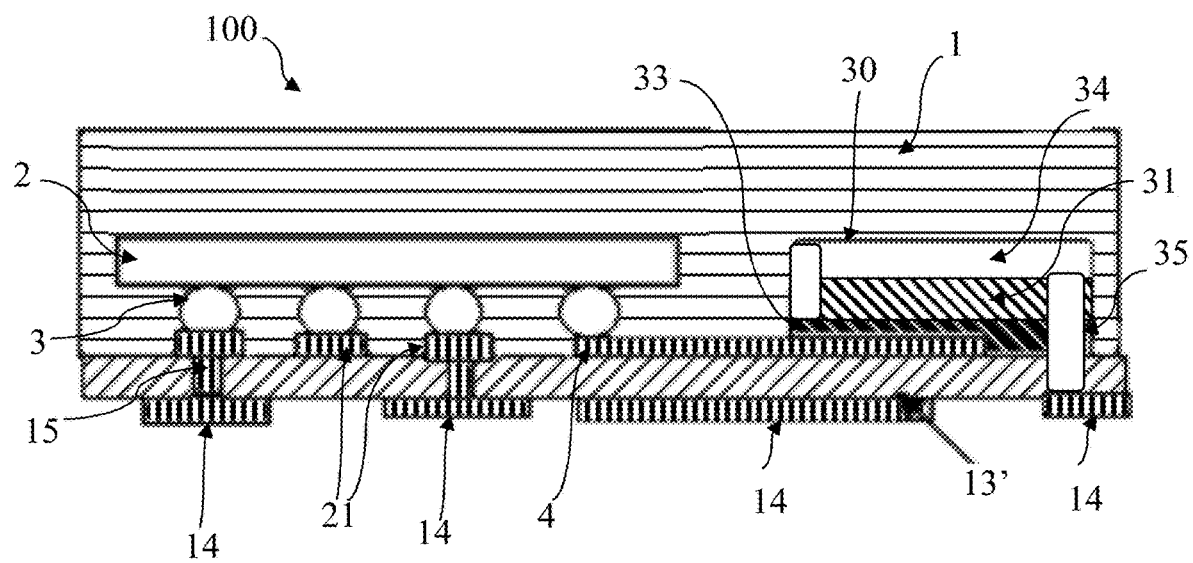
FIG. 8 shows a cross-sectional view of an integrated circuit package comprising a back-short according to a further embodiment of the present disclosure.

FIG. 8 shown the package 100 in FIG. 7, wherein the shield comprises a back-short 30 rather than a periodically structured shield. The first layer (or substrate) 31 of the shield comprises a conductive cover 34. The conductive cover 34 is connected to the land grid array (or package terminals 14) by vias 35. The back-short 30 is mounted above the waveguide launcher 4 and to a top surface of the multi-layer laminate 13' by a non-conductive adhesive 33. In other embodiments, the adhesive 33 may not be provided (as in FIG. 6).

Figure 9:
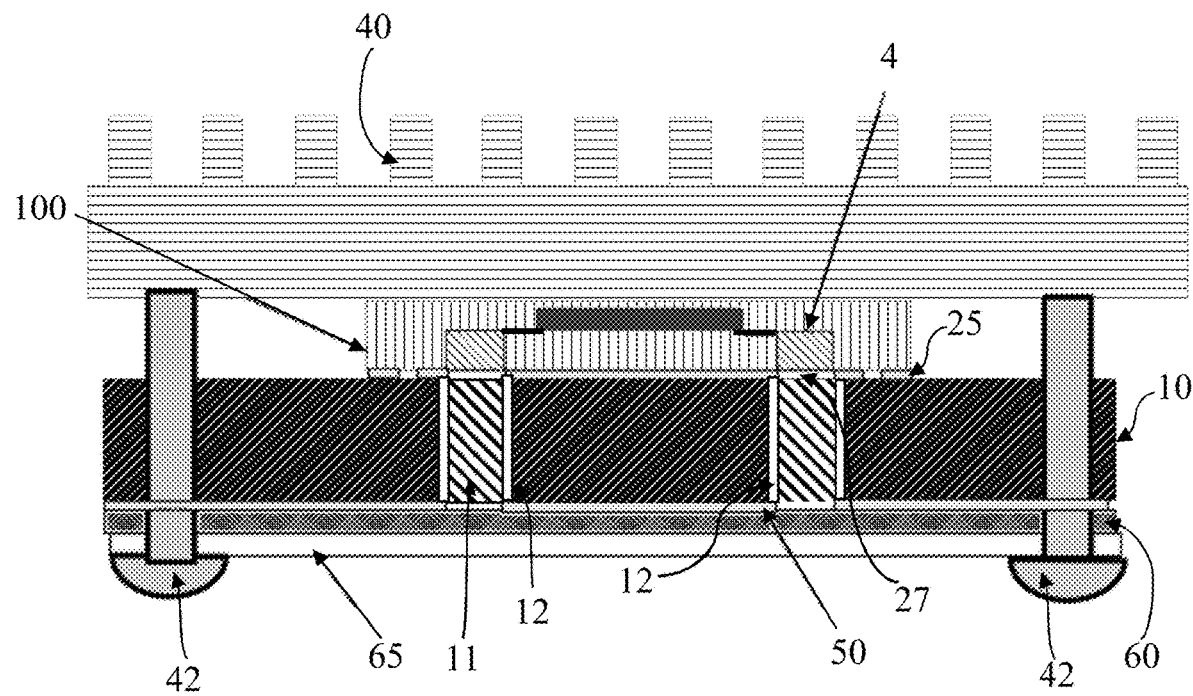
FIG. 9 shows a cross-sectional view of a semiconductor device according to an embodiment of the present disclosure.

A further embodiment of a semiconductor device according to the present disclosure is shown in FIG. 9. A heat sink 40 is in contact with a top surface of the package 100. The heat sink 40 is connected to the semiconductor device by a pair of mechanical fixings 42 such as bolts or screws. The mechanical fixings 42 may also add stability and strength to the semiconductor device.

The integrated circuit package 100 comprises integrated waveguide launchers 4 and is mounted to a PCB 10 by a land grid array 25. The PCB 10 comprises dielectric filled waveguides 11 having a metalized lining 12. The land grid array 25 comprises openings 27 that are aligned with the waveguide launchers 4 and waveguides 11. The PCB 10 comprises a metal layer 50 that connects the PCB 10 to an antenna feed network 60. The antenna feed network 60 is coupled to an antenna array 65. The antenna array 65 may, for example, be a slot antenna array.

Figure 10:
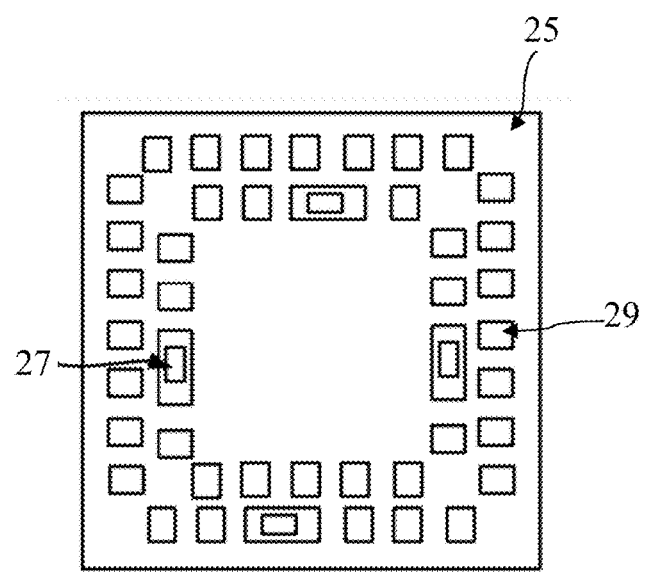
FIG. 10 shows a bottom view of an embodiment of a land grid array according to the present disclosure.

A bottom view of an embodiment of a land grid array 25 is shown in more detail in FIG. 10. The land grid array 25 comprises a plurality of package terminals or AC/DC contact pads 29. Four of the package terminals 29 each comprise an opening 27. In some embodiments, more or less than four openings 27 may be provided. In this embodiment, the openings 27 are rectangular to match a rectangular waveguide. However, it will be appreciated that the shape and size of openings 27 are preferably selected to match the waveguide 11 in the PCB. This matching may prevent the presence of discontinuities in the path taken by electromagnetic radiation, thereby reducing losses.

Figure 11:
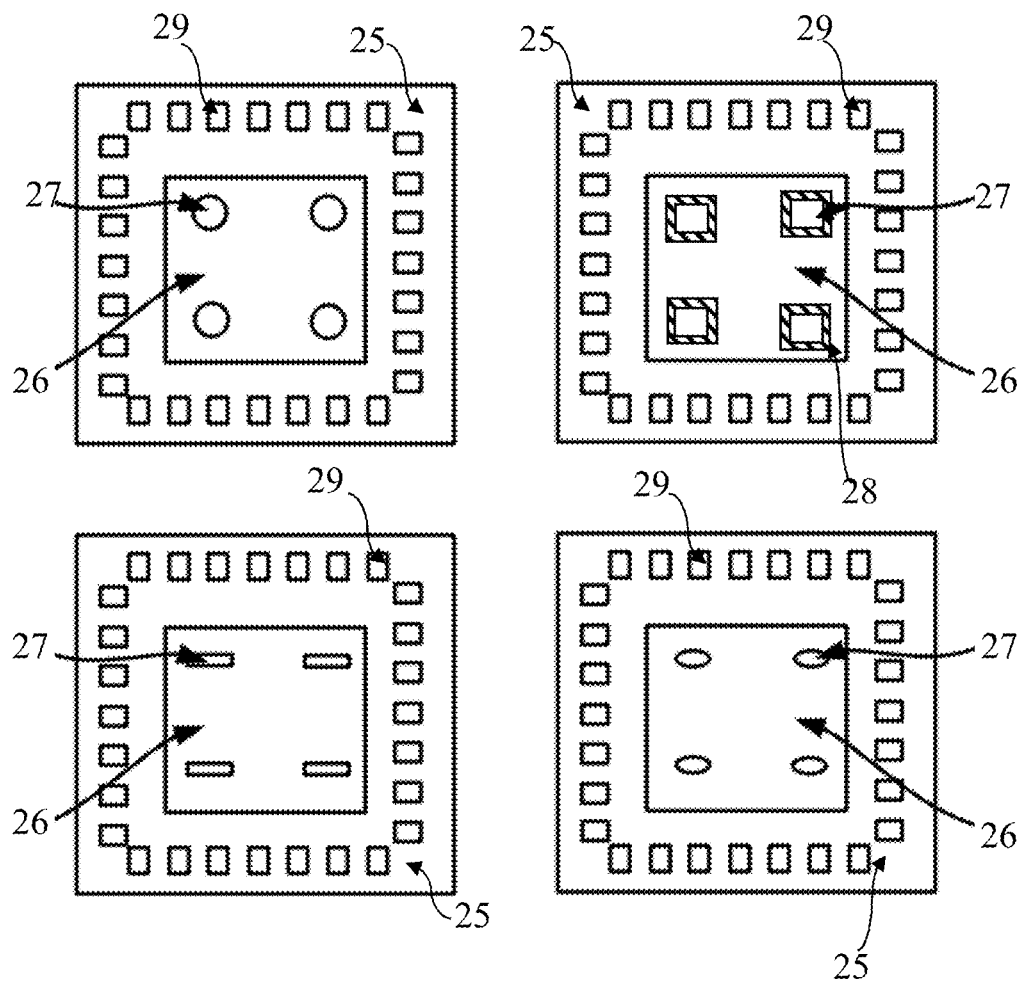
FIG. 11 shows a bottom view of four further embodiments of land grid arrays according to the present disclosure.

FIG. 11 shows four more embodiments of land grid arrays 25 according to the present disclosure. In these embodiments, the waveguide openings 27 are provided in a metal pad 26 rather than in the package terminals 29. The metal pad 26 may be a copper pad. It will be appreciated that although the metal pad 26 is shown as a square shape which is positioned centrally on the land grid array 25, other shapes and positions may be used. As shown, the openings 27 may be circular, square, rectangular, slotted and/or elliptical. The openings 27 may be surrounded by soldermask 28 as shown in the top-right diagram in FIG. 11. The soldermask 28 prevents solder from following into the opening 27 which could potentially create a short circuit.

Figure 12:
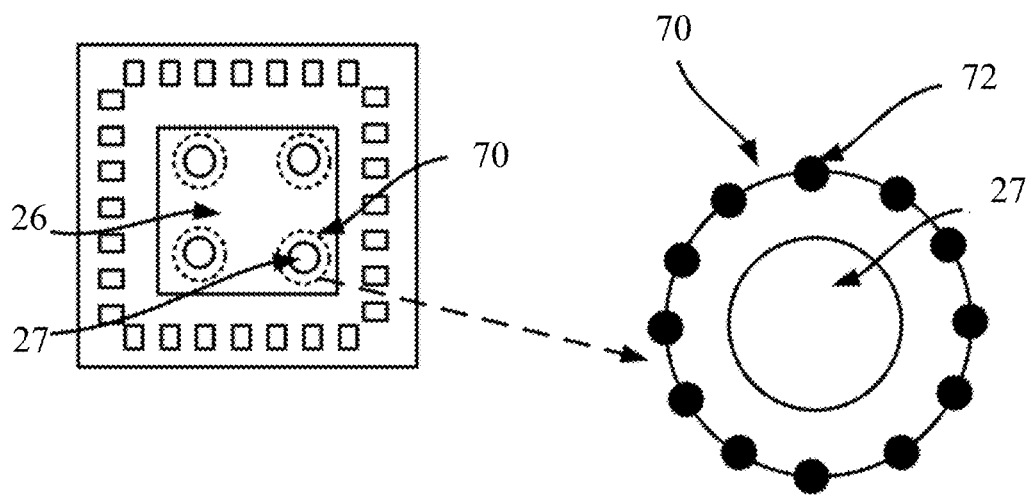
FIG. 12 shows a bottom view of a further embodiment of a land grid array and a close-up portion of a waveguide opening according to the present disclosure.

As shown in FIG. 12, the openings 27 may be surrounded by a ring 70 of vias or micro-vias 72. The vias 72 may be filled with electrically conductive material. The ring 70 may connect the land grid array 25 to the lead frame or redistribution layer of the package 100. The vias 72 can serve as a barrier to prevent radiation leakage from openings 27, thereby preventing radiation from one opening 27 reaching another opening 27.

Figure 13:
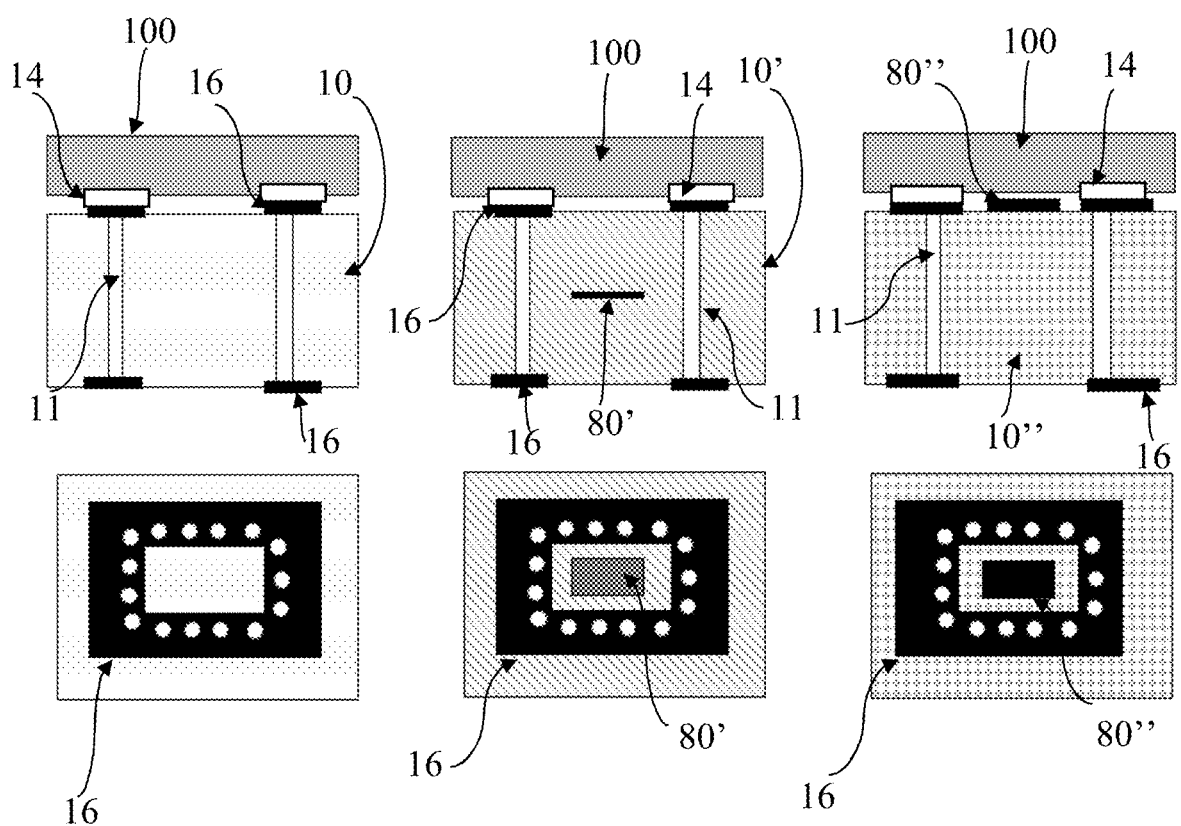
FIG. 13 illustrates the use of patch antennas to match an integrated circuit package to three different PCB substrates.

FIG. 13 illustrates the use of resonant patch antennas to match an integrated circuit package 100 to three different PCB substrates 10, 10' and 10". Although a package 100 may be designed to match a particular PCB substrate, it may be desired to use the package 100 with a different substrate. Thus, the PCB may need to be matched to the package 100 using a resonant patch. The top row in FIG. 13 shows three simplified cross-sectional diagrams of semiconductor devices, and the bottom row shows a top view of the corresponding PCB.

In the far-left diagram in FIG. 13, the PCB 10 is made of a similar material to the package substrate, so no impedance matching is required. In the middle diagram, the PCB substrate 10' is different to the package substrate and so a resonant patch 80' is inserted into an inner layer of the PCB. It will be appreciated that the patch 80' could alternatively be placed on the top or bottom of the PCB. In the far-right diagram in FIG. 13, a resonant patch 80" is placed on the top of the PCB 10" in order to match the PCB 10" to the package substrate. This matching may prevent the presence of discontinuities in the path taken by electromagnetic radiation, thereby reducing losses.

In FIG. 13 a rectangular waveguide and rectangular waveguide is shown. However, it will be appreciated that any shape of waveguide may be used, such as elliptical or circular. The waveguide is preferably matched to the shape of the opening 27 in the land grid array (as described in FIG. 11).

Accordingly, there has been described an integrated circuit package and a semiconductor device incorporating an integrated circuit package. The integrated circuit package comprises an encapsulant and a semiconductor die (or chip) in the encapsulant. The semiconductor die comprises a plurality of die terminals. A waveguide launcher is also integrated into the package, wherein the integrated waveguide launcher is connected to one of the die terminals. A land grid array is provided on a bottom surface of the package, the land grid array comprising a plurality of package terminals, each package terminal configured to be soldered to a connection, and an opening, wherein the opening is aligned with the integrated waveguide launcher. Each package terminal may be soldered to a PCB comprising a waveguide. The waveguide may be aligned with the opening provided in the land grid array.

Although particular embodiments of this disclosure have been described, it will be appreciated that many modifications, additions and/or substitutions may be made within the scope of the appended claims.

What is claimed is:

1. An integrated circuit package comprising:
   an encapsulant;
   a semiconductor die in the encapsulant, the semiconductor die comprising a plurality of die terminals;
   an integrated waveguide launcher, wherein the integrated waveguide launcher is connected to one of the die terminals; and
   a land grid array provided on a bottom surface of the package, the land grid array comprising:
      a plurality of package terminals, each package terminal configured to be soldered to a connection;
      a metal pad substantially surrounded by the plurality of package terminals; and an opening formed in the metal pad, wherein the opening is aligned with the integrated waveguide launcher.

2. The integrated circuit package of claim 1, comprising a shield arranged to reflect radiation from the waveguide launcher towards the waveguide opening.

3. The integrated circuit package of claim 2, wherein the shield comprises a layer of silicon, or epoxy, or PCB laminate.

4. The integrated circuit package of claim 2, wherein the shield is a periodically structured shield, or wherein the shield comprises a back-short.

5. The integrated circuit package of claim 1, comprising a redistribution layer between the semiconductor die and the land grid array, wherein the waveguide launcher is provided in the redistribution layer.

6. The integrated circuit package of claim 5, wherein the redistribution layer comprises a single metal layer.

7. The integrated circuit package of claim 2, comprising a multi-layer laminate between the semiconductor die and the land grid array, wherein the shield is attached by a non-conductive adhesive to the multi-layer laminate.

8. A semiconductor device, comprising:
an integrated circuit comprising:
an encapsulant;
a semiconductor die in the encapsulant, the semiconductor die comprising a plurality of die terminals;
an integrated waveguide launcher, wherein the integrated waveguide launcher is connected to one of the die terminals; and
a land grid array provided on a bottom surface of the package, the land grid array comprising:
a plurality of package terminals, each package terminal configured to be soldered to a connection;
a metal pad substantially surrounded by the plurality of package terminals; and
an opening formed in the metal pad, wherein the opening is aligned with the integrated waveguide launcher; and
a printed circuit board, PCB, comprising a waveguide, wherein:
each package terminal is soldered to the PCB; and
the waveguide is aligned with the opening provided in the land grid array.

9. The semiconductor device of claim 8, wherein the waveguide is a dielectric filled waveguide.

10. The semiconductor device of claim 8, wherein the shape of the opening is configured to match the waveguide in the PCB.

11. The semiconductor device of any of claim 8, wherein the PCB comprises a resonant patch antenna configured to match the land grid array to the waveguide.

12. The semiconductor device of claim 8, further comprising a heat sink, wherein the heat sink is in contact with a top surface of the integrated circuit package.

13. The semiconductor device of claim 8, further comprising:
an antenna feed network coupled to the PCB; and
an antenna array coupled to the antenna feed network.

14. An integrated circuit package comprising:
an encapsulant;
a semiconductor die in the encapsulant, the semiconductor die comprising a plurality of die terminals;
an integrated waveguide launcher, wherein the integrated waveguide launcher is connected to one of the die terminals; and
a land grid array provided on a bottom surface of the package, the land grid array comprising:
a plurality of package terminals, each package terminal configured to be soldered to a connection;
a metal pad substantially surrounded by the plurality of package terminals; and
an opening formed in the metal pad, wherein the opening is aligned with the integrated waveguide launcher.

15. The integrated circuit package of claim 14, comprising a shield arranged to reflect radiation from the waveguide launcher towards the waveguide opening.

16. The integrated circuit package of claim 15, wherein the shield comprises a layer of silicon, or epoxy, or PCB laminate.

17. The integrated circuit package of claim 14, comprising a redistribution layer between the semiconductor die and the land grid array, wherein the waveguide launcher is provided in the redistribution layer.

* * * * *